United States Patent [19]
Steffan et al.

[11] Patent Number: 5,999,003
[45] Date of Patent: Dec. 7, 1999

[54] INTELLIGENT USAGE OF FIRST PASS DEFECT DATA FOR IMPROVED STATISTICAL ACCURACY OF WAFER LEVEL CLASSIFICATION

[75] Inventors: Paul J. Steffan, Elk Grove; Ming Chun Chen, Irvine, both of Calif.

[73] Assignee: Advanced Micro Devices, Inc., Sunnyvale, Calif.

[21] Appl. No.: 08/989,831

[22] Filed: Dec. 12, 1997

[51] Int. Cl.⁶ .......................... G01R 21/26; H01L 21/66; G06K 9/00
[52] U.S. Cl. .......................... 324/537; 324/765; 438/17; 364/468.17; 382/149; 702/35
[58] Field of Search .................. 324/765, 766, 324/767, 537; 714/25, 27; 438/14, 17; 364/480, 490, 468.17; 702/35; 395/500; 382/145, 149

[56] References Cited

U.S. PATENT DOCUMENTS

| | | | |
|---|---|---|---|
| 5,240,866 | 8/1993 | Friedman et al. | 702/35 |
| 5,539,752 | 7/1996 | Berezin et al. | 702/35 |
| 5,649,169 | 7/1997 | Berezin et al. | 395/500 |
| 5,777,901 | 7/1998 | Berezin et al. | 364/490 |
| 5,801,965 | 9/1998 | Takagi et al. | 364/468.17 |
| 5,828,778 | 10/1998 | Hagi et al. | 382/145 |
| 5,862,055 | 1/1999 | Chen et al. | 364/468.17 |

*Primary Examiner*—Diep N. Do
*Attorney, Agent, or Firm*—H. Donald Nelson

[57] ABSTRACT

A method to accurately classify defects on a semiconductor wafer wherein a scanning tool detects defects and assigns values to parameters that are characteristic of each defect. The values of the characteristic parameters represent a thumbprint of each defect and the defects are placed into "bins" according to the thumbprint of each defect. A sample of defects in each bin is analyzed and assigned a classification code.

4 Claims, 3 Drawing Sheets

INTELLIGENT USAGE OF FIRST PASS DEFECT DATA FOR IMPROVED STATISTICAL ACCURACY OF WAFER LEVEL CLASSIFICATION

BACKGROUND OF THE INVENTION

1. Field of the Invention

This invention relates generally to a method of defect classification in a semiconductor manufacturing testing system. More specifically, this invention relates to a method of defect classification in a semiconductor manufacturing testing system in which a scanning tool that uses parametric defect data to provide a thumbprint of each defect and the defects are placed in "bins" according to the thumbprints.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects during the manufacturing process. The number of good chips obtained from a wafer determines the yield. As can be appreciated, chips that must be discarded because of a defect or defects increases the cost of the remaining usable chips.

A single semiconductor chip can require numerous process steps such as oxidation, etching, metallization and wet chemical cleaning. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

Although it would be desirable to be able to identify and analyze each defect on each wafer in every manufacturing run, it is not practical. In practice, a particular lot (a number of wafers) is selected to be representative of the manufacturing run. A single wafer or multiple wafers is then selected from the lot to be analyzed. Because of the number of processes, it may not be possible to reanalyze each wafer after each process. Therefore, only certain processes are analyzed. The wafer is placed in an inspection tool that identifies defects after each process that is to be analyzed. The inspection tool scans the wafer and detects the defects on the wafer. As the tool detects each defect, the tool measures certain parameters that are descriptive of the defect. These parameters consist of 80 or more characteristics, such as estimated size, polarity, intensity, color, brightness, and roundness. This data is for the most part unused. After the complete wafer is scanned, a wafer classifier inspects a random sample of the defects and assigns a classification code to each defect. These classifications are charted into a Pareto Chart format that gives an indication of the total defect distribution across the wafer. However, this method is inherently inaccurate for two reasons, the random nature of the selection of the defects to analyze and the small sample size chosen for classification.

Therefore, what is needed is a method to improve the extrapolated accuracy of the defect distribution across the entire wafer.

SUMMARY OF THE INVENTION

A defect classification system in accordance with the present invention solves the above and other problems associated with the conventional defect classification system.

The above and other objects and advantages of the present invention are attained by providing a method that uses the parametric defect data collected by a scanning tool that scans a wafer to detect defects. The parametric defect data provides a "thumbprint" of each defect. All of the defects having similar thumbprints are placed into bins. Defects from each bin are then randomly selected to represent an accurate cross-section of the entire defect population across the entire wafer. The selected defects from each bin are classified. If defects within a bin are classified consistently, that classification can be applied to the entire population of that bin. If classifications are split within a bin, the classifications can be split along the same percentages over the entire population of the bin. This method provides a more accurate representation of the defect population of the entire wafer.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
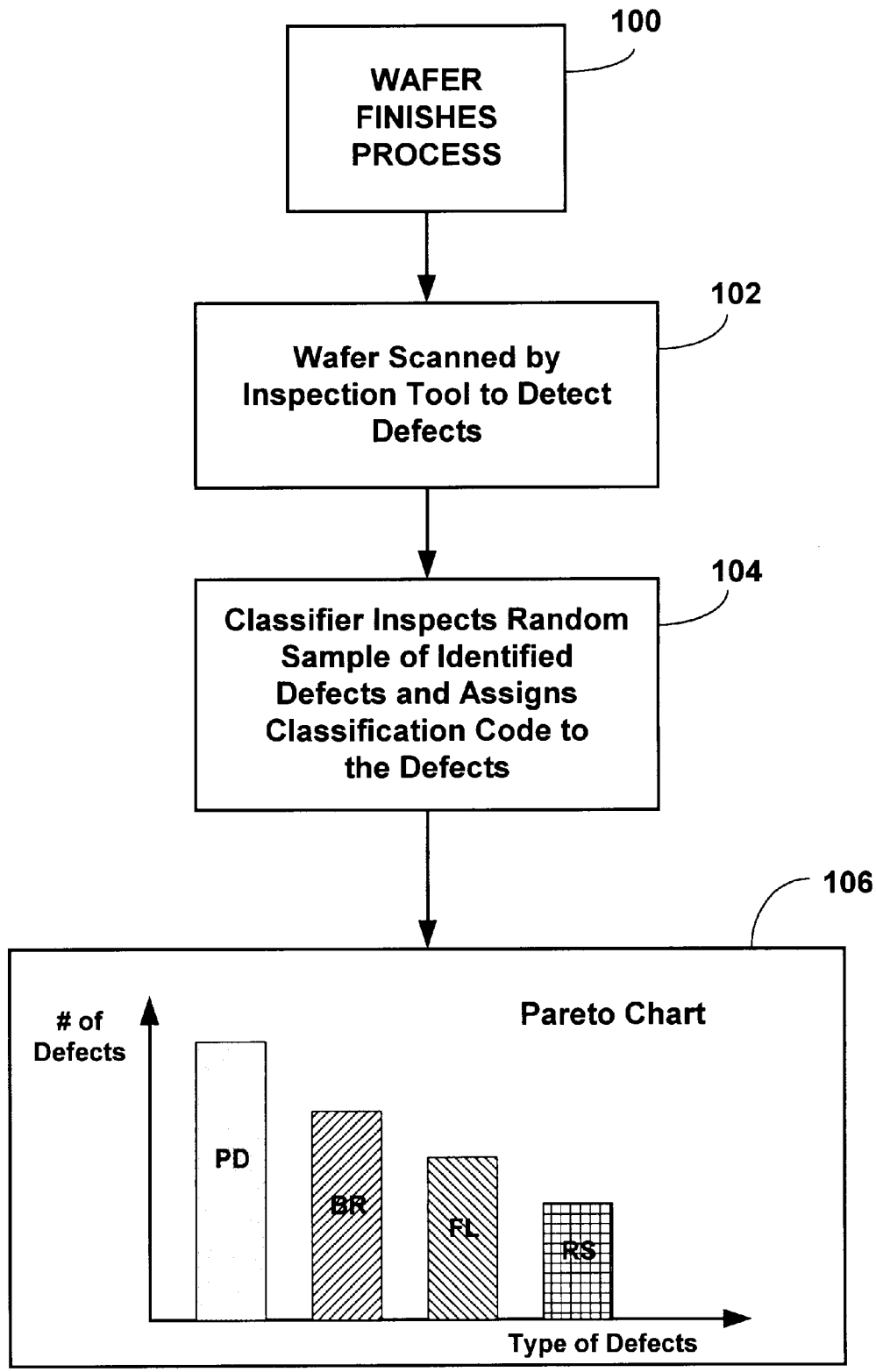
FIG. 1 illustrates a prior method of defect classification.

FIG. 1 illustrates a prior art method of defect classification as currently used in the testing of semiconductor wafers in the semiconductor manufacturing art. After a wafer finishes a process at 100 and the process is one of the processes that has been selected to be analyzed, the wafer is scanned by an inspection tool at 102. The inspection tool at 102 detects and maps all of the defects on the wafer. The inspection tool at 102 measures parameters that are characteristic of each defect and the values of the measured parameters provide a "thumbprint" of the defect. A classifier then selects and inspects a random number of the detected defects at 104 and assigns a classification code to the inspected defects. The numbers of defects are charted in a Pareto Chart as shown at 106. The Pareto Chart shows the number of defects by type. For example, the type of defect may be a pattern defect (PD), a bridging defect (BR), an embedded particle (EP), a flake (FL) or a residual (RS) defect. It should be understood that these are examples only and there can be other types of defects that would be detected and analyzed.

Figure 2A:
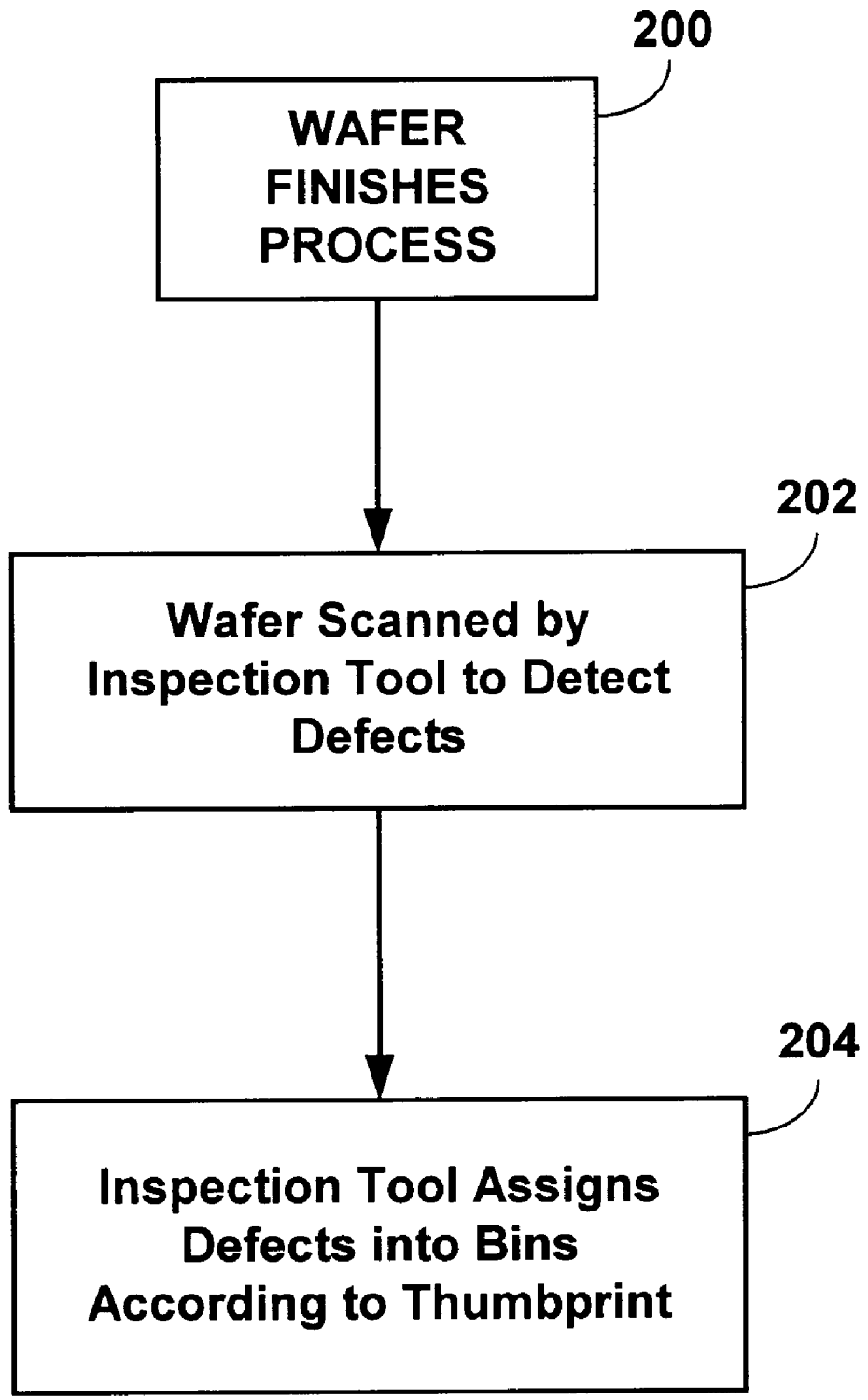
FIG. 2A illustrates the method of defect classification in accordance with the present invention.

Referring to FIG. 2A there is shown the method of defect classification in accordance with the present invention. After a wafer finishes a process at 200 and the process is one of the processes that has been selected to be analyzed, the wafer is scanned by an inspection tool at 202. The inspection tool at 102 detects and maps all of the defects on the wafer. The inspection tool at 102 measures parameters that are characteristic of each defect and the values of the measured parameters provide a "thumbprint" of the defect. Because it is impossible to analyze each defect, only a selected number of the total number of defects are analyzed. The inspection tool at 204 assigns each defect to a "bin" according to the thumbprint of each defect.

Figure 2B:
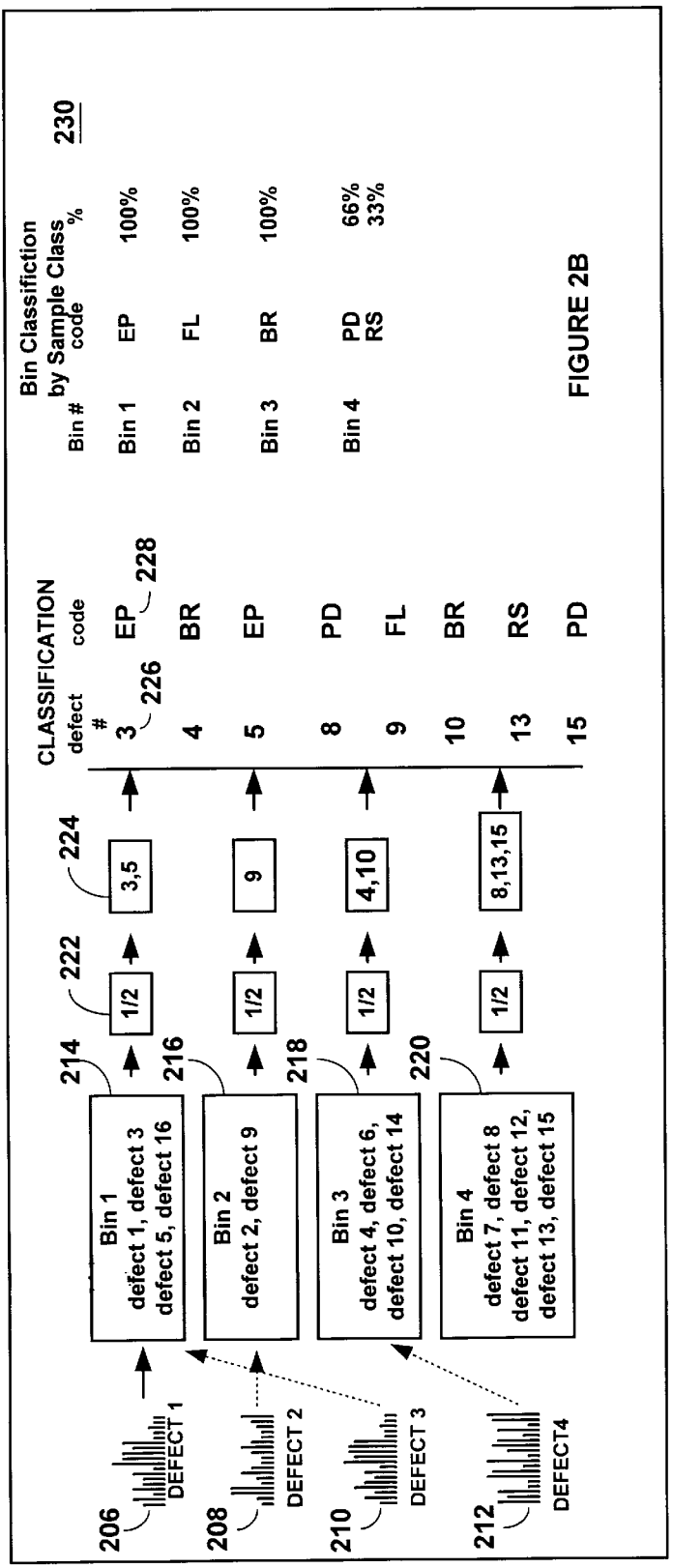
FIG. 2B shows the method of obtaining defect classifications for the defects that have been placed in particular bins according to a thumbprint of each defect.

FIG. 2B shows the method of obtaining defect classifications for the defects that have been placed in particular bins according to the thumbprint of each defect. Examples of four defects are shown at 206, 208, 210 and 212. The "bins" are shown at 214, 216, 218 and 220. As shown, defect 1, at 206 and defect 3, at 210 are placed in Bin 1 at 214. Defect 2, at 208, is placed into Bin 2, at 216, and defect 4, at 212 is placed into Bin 3, at 218. It is noted that Bin 1 214 has a total of 4 defects, Bin 2 216 has a total of 2 defects, Bin 3 218 has a total of 4 defects and Bin 4 220 has a total of 6 defects. For illustrative purposes, it is assumed that the total number of defects selected to be analyzed is 16 and that the total number of defects detected is 32. The ratio of the number of defects from each bin to be analyzed and assigned a classification code is calculated by dividing the number of defects to be analyzed (16) by the total number of defects detected (32). The calculated ratio is ½ and is indicated at 222. The ratio of ½ indicates that ½ of the defects assigned to each bin are to be analyzed and assigned a classification code. The boxes at 224 indicate the number of the defect from each bin that is analyzed and assigned a classification code. For example, defects 3 and 5 from Bin 1 at 214 are analyzed. The column at 226 lists the defects and the column at 228 lists the classification code assigned to each defect in the column at 226. The values at 230 show the bin classification by sample class relating the type of defects in each bin. The use of the classification is as follows. For example, all of the defects from Bin 1 that were analyzed were EP (embedded particle) defects. Because 100% of the defects analyzed in Bin 1 were EP defects, the remaining defects in Bin 1 are assumed to be EP defects. Similarly, the defects that were analyzed in Bin 4 were 66% PD (pattern defects) and 33% RS (residual defects). Therefore, the remaining defects assigned to Bin 4 were assumed to be 66% PD and 33% RS defects. Because all of the defects detected on the wafer were assigned to a Bin, all of the defects on the wafer are classified. These data allow the extension or extrapolation of the data more accurately to the population of defects on the entire wafer.

Figure 2C:
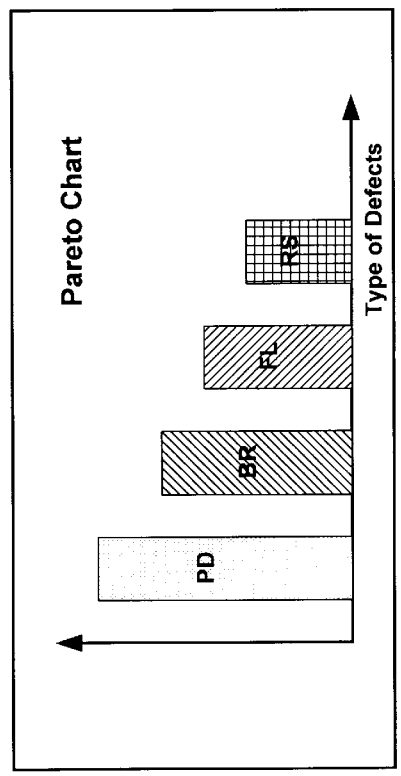
FIG. 2C is a Pareto Chart of all defects on the wafer.

FIG. 2C is a Pareto Chart showing the total number of defects on the semiconductor wafer. The number of each defect is extrapolated from the data show at 230 in FIG. 2B.

The benefits of the present invention are:

1. The defects are chosen in the classification sampling plan that are representative of the distribution of actual defects on the wafer.

2. More accurate pareto information of wafer level defect population is obtained.

3. There is no additional overhead required to obtain the much improved defect data.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method to accurately classify defects on a semiconductor wafer, the method comprising:

(a) sending a wafer through a processing step;

(b) detecting defects on the wafer in a scanning tool wherein parameters characteristic of each defect are measured wherein the measured parameters represent a thumbprint of the defect;

(c) assigning each defect to a bin in accordance with the thumbprint of each defect;

(d) calculating a ratio to determine the number of defects from each bin to be analyzed by dividing the total number of defects to be analyzed from all bins by the total number of defects assigned to all bins;

(e) selecting the number of defects from each bin by multiplying the number of defects in each bin by the ratio calculated in step (d); and (f) analyzing the number of defects selected from each bin in step (e) and assigning a classification code to the analyzed defects.

2. The method of claim 1 further comprising (g) determining a percentage of defects of each classification code in each bin determined during step (f).

3. The method of claim 2 further comprising (h) assigning classification codes to the remaining defects in each bin in the same percentage as determined in step (g).

4. The method of claim 3 further comprising (i) determining a percentage of defects of each classification code on the entire wafer based on the percentage of defects of each classification code in each bin determined in steps (g) and (h).

* * * * *